US007312142B2

United States Patent
Hwan

(10) Patent No.: US 7,312,142 B2
(45) Date of Patent: Dec. 25, 2007

(54) METHOD FOR MAKING CABLE WITH A CONDUCTIVE BUMP ARRAY, AND METHOD FOR CONNECTING THE CABLE TO A TASK OBJECT

(75) Inventor: Lu-Chen Hwan, Taipei (TW)

(73) Assignee: Mutual Pak Technology Co., Ltd., Xinzhuang (TW)

( * ) Notice: Subject to any disclaimer, the term of this patent is extended or adjusted under 35 U.S.C. 154(b) by 232 days.

(21) Appl. No.: 11/106,151

(22) Filed: Apr. 13, 2005

(65) Prior Publication Data

US 2006/0234460 A1    Oct. 19, 2006

(51) Int. Cl.
*H01L 21/44* (2006.01)
(52) U.S. Cl. ............... 438/612; 257/E21.508
(58) Field of Classification Search ........... 438/612; 257/E21.508
See application file for complete search history.

(56) References Cited

U.S. PATENT DOCUMENTS

| 4,584,039 | A | * | 4/1986 | Shea ..................... 156/150 |
| 4,909,909 | A | * | 3/1990 | Florjancic et al. ........... 205/125 |
| 6,653,235 | B2 | | 11/2003 | Liang et al. |
| 6,864,119 | B2 | * | 3/2005 | Seko ..................... 438/106 |
| 7,019,393 | B2 | * | 3/2006 | Toriyama ................. 257/692 |

FOREIGN PATENT DOCUMENTS

TW    488052    5/2001

* cited by examiner

*Primary Examiner*—Michael Lebentritt
*Assistant Examiner*—Stanetta Isaac
(74) *Attorney, Agent, or Firm*—Snell & Wilmer L.L.P.

(57) ABSTRACT

A cable with conductive bumps is fabricated by forming a photoresist layer with multiple openings on a cable substrate, coating a conductive layer on the photoresist layer whereby the conductive layer in the openings forms the bumps at circuits on the cable substrate, and then removing the photoresist layer. When connecting the cable to a task object such as an LCD glass substrate or PCB, only a usual non-conductive paste is applied to join the cable and the task object, without use of expensive anisotropic-conductive paste or film.

13 Claims, 7 Drawing Sheets

METHOD FOR MAKING CABLE WITH A CONDUCTIVE BUMP ARRAY, AND METHOD FOR CONNECTING THE CABLE TO A TASK OBJECT

BACKGROUND OF THE INVENTION

1. Field of the Invention

The invention relates to a method for making a cable with conductive bumps arranged in an array and a method for connecting the cable to an electronic component, more particularly, the cable can electrically connect to the electronic component without need for an anisotropic-conductive paste or film (ACP or ACF).

2. Related Art

Anisotropic-conductive paste (ACP) or anisotropic-conductive film (ACF) has been commonly applied as a major compound for connecting a cable to an integrated circuit (IC) or attaching a circuit board to an LCD glass substrate. The major ingredient of the ACP or ACF comprises a great quantity of small conductive particles contained in glue.

When electrically connecting the LCD glass substrate to the circuit board by the ACP or ACF through a pressing process, the conductive particles will be distributed between the substrate and the circuit board. For regions where these particles have been pressed, the particles serve as conductive material between the substrate and the circuit board. On the contrary, for regions where the particles have not been pressed, electrical signals can not be transmitted between the substrate and the circuit board even though they are joined together by the glue.

For example, with reference to FIGS. 6A and 6B, a cable (70) has multiple conductive circuits (71) that are electrically connected to substrate terminals (not numbered) on a substrate (72) by ACP/ACF (80). The ACP/ACF (80) that contains the conductive particles (81) is distributed between the cable (70) and the substrate (72). The substrate (72) can be an LCD glass substrate, a printed circuit board etc. For an LCD glass substrate, the substrate terminals can be formed by indium tin oxide (ITO) or metal wires.

With reference to FIG. 7, the ACP/ACF (80) is applied to join terminals (74) of an integrated circuit (IC)(73) to the circuits (71) of the cable (70). The particles (81) that have been pressed in the ACP/ACF (80) also serve as material to make an electrical connection between the terminals (74) and the circuits (71).

With reference to FIG. 8, in another embodiment of prior art, non-conductive film or paste (NCF or NCP) (82) is applied to join the IC (73) and the cable (70) together. The terminals (74) of the IC directly contact the circuits (71) of the cable (70). The disadvantage raised in this prior art is the unsatisfactory reliability of connection between the IC (73) and the cable (70). If the circuits (71) mis-align with the terminals (74), a defective electrical connection may possibly exist between cable (70) and the IC (73) because no conductive particles are contained in the NCF/NCP (82).

Although using the ACP/ACF (80) can solve the drawback of the device in FIG. 8, the ACP/ACF (80) still causes other problems.

1. Specific space is required where the glue of ACP/ACF can flow between the cable and the substrate or IC. However, the conductive particles may thus be unequally distributed due to the flowing motions of the glue. The connecting reliability is then reduced.

2. The width and length of the conductive circuits must be carefully determined upon the sizes of the particles, otherwise an undesired short circuit or a failed electrical connection between the cable and the task object accordingly occur.

3. The fabricating processes of the ACP/ACF are complex.

4. The cost of the ACP/ACF is quite high since only a particular material is suitable for manufacture of the conductive particles.

For the above reasons, a novel cable is proposed to overcome the shortcoming of the prior arts using the ACP/ACF.

SUMMARY OF THE INVENTION

An objective of the present invention is to provide a method for making a cable with conductive bumps, wherein the cable can be electrically connected to any task electronic element without use of anisotropic-conductive paste.

To achieve the objective, the method in accordance with the present invention includes the acts of:
  forming multiple conductive circuits on a surface of a cable substrate;
  coating a photoresist layer over the multiple conductive circuits, wherein multiple openings are formed on the photoresist layer, and some of the openings overlap on the conductive circuits;
  forming conductive bumps at the openings that overlap the conductive circuits so that the conductive bumps protrude from surfaces of the conductive circuits;
  removing the photoresist layer from the cable substrate; and
  coating a protective layer on the conductive bumps.

Further advantages, features and details of the present invention will be elucidated on the basis of the following description of a preferred embodiment thereof, with reference to the annexed figures.

DETAILED DESCRIPTION OF THE PREFERRED EMBODIMENT

The present invention provides a method to form cable with micro-bumps arranged in an array configuration. Therefore, the ACP or ACF used in prior art is now not necessary for connecting the cable to a task object such as an LCD glass substrate or a PCB. Since the function of the conventional conductive particles is performed by the micro-bumps, only the usual and easily acquired non-conductive paste is used for connection.

Figure 1A:
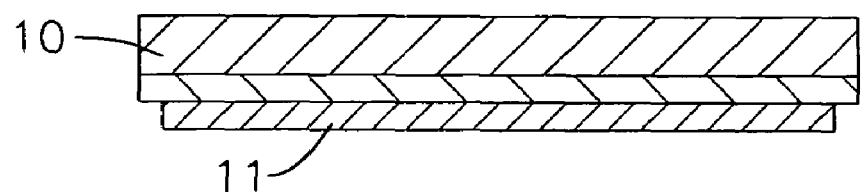
FIG. 1A is a cross-sectional view showing a cable in accordance with the present invention.
Figure 1B:
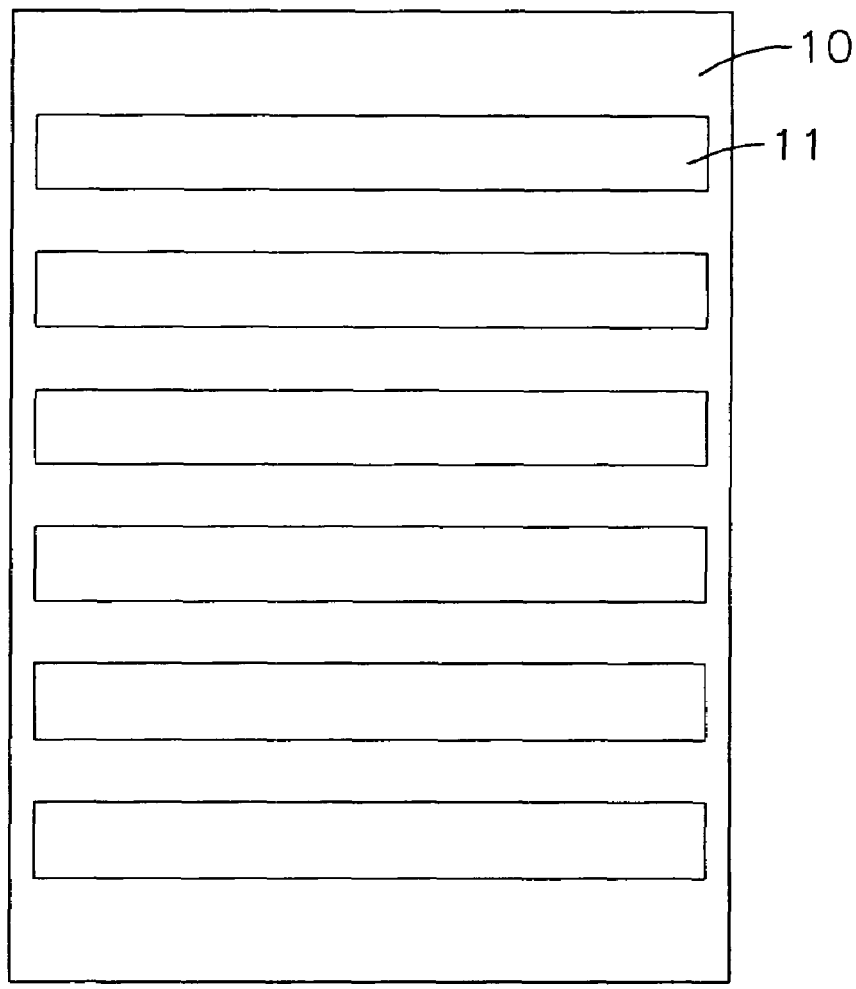
FIG. 1B is a bottom plan view of FIG. 1.

With reference to FIGS. 1A and 1B, multiple conductive circuits (11) are formed on a surface of a cable substrate such as a flexible board or a printed circuit board (PCB) to construct a cable (10).

Figure 2A:
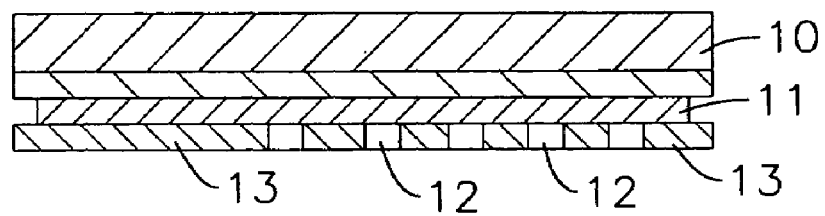
FIG. 2A is a cross-sectional view showing a photoresist layer formed on the cable in accordance with the present invention.
Figure 2B:
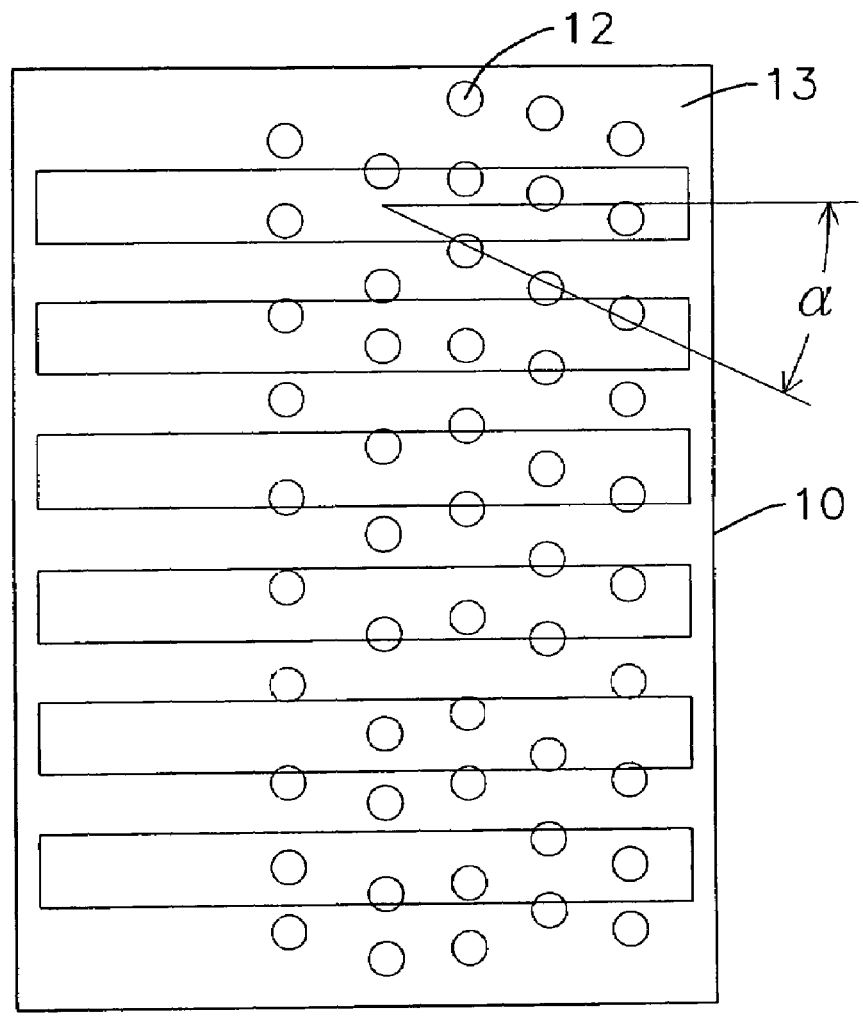
FIG. 2B is a bottom plan view of FIG. 2A.

With reference to FIGS. 2A and 2B, a photoresist layer (13) with multiple openings (12) is formed on the same surface over the circuits (11) by a photo mask. Since these openings (12) are arranged in an array configuration and equally or randomly distributed over the circuits (11), these openings (12) do not need to be purposely formed at specific positions just over the circuits (11). However, the density of the openings (12) should be carefully considered upon the lengths or widths of the circuits (11). Preferably, an included angle approximate 45 degrees as indicated by $\alpha$ can be defined by the openings (12) aligned on a line and the circuits. In other words, the random distribution of the openings (12) can ensure that each circuit (11) has a plurality of openings (12) positioned thereon.

Figure 3A:
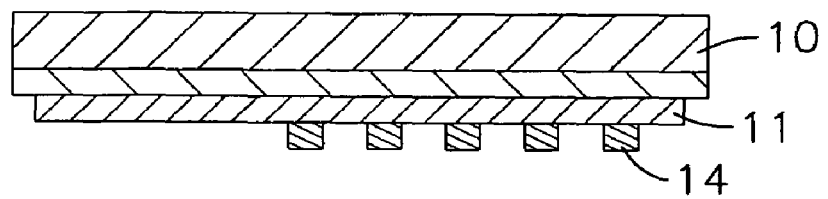
FIG. 3A is a cross-sectional view showing conductive bumps are formed on the cable in accordance with the present invention.
Figure 3B:
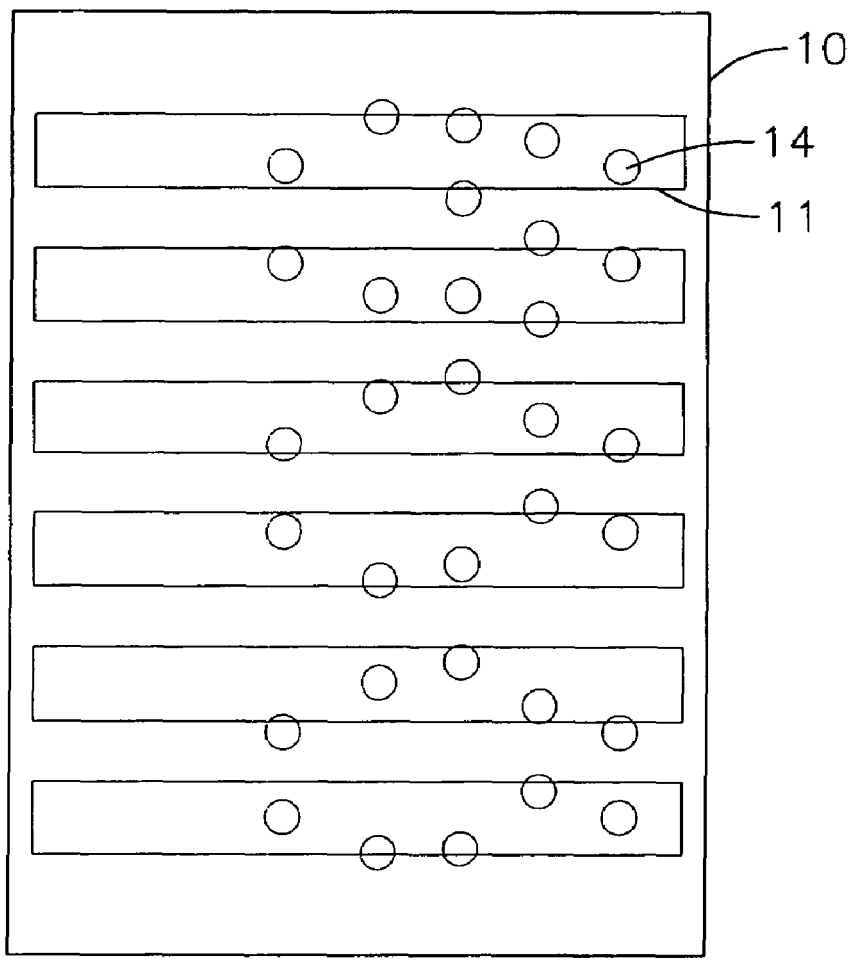
FIG. 3B is a bottom plan view of FIG. 3A.

With reference to FIGS. 3A and 3B, conductive bumps (14) are formed at the openings (12) by the electroplating processes or other means. When using the electroplating processes, the conductive bumps (14) are specifically and exclusively formed at the conductive surface, i.e. at positions where the openings (12) and the circuits (11) overlap each other although the remaining openings (12) also experience the electroplating processes. When the electroplating processes are finished, the photoresist layer (13) is then removed to expose the conductive bumps (14) protruding from the circuits (11). These conductive bumps (14) can then be preferably coated with a protective layer consisting of tin, nickel, gold etc. on their surfaces. Therefore, a cable with conductive bumps in accordance with the present invention is formed. As to the connection between the cable and the LCD glass substrate or the PCB, this will be further described hereinafter.

Figure 4A:
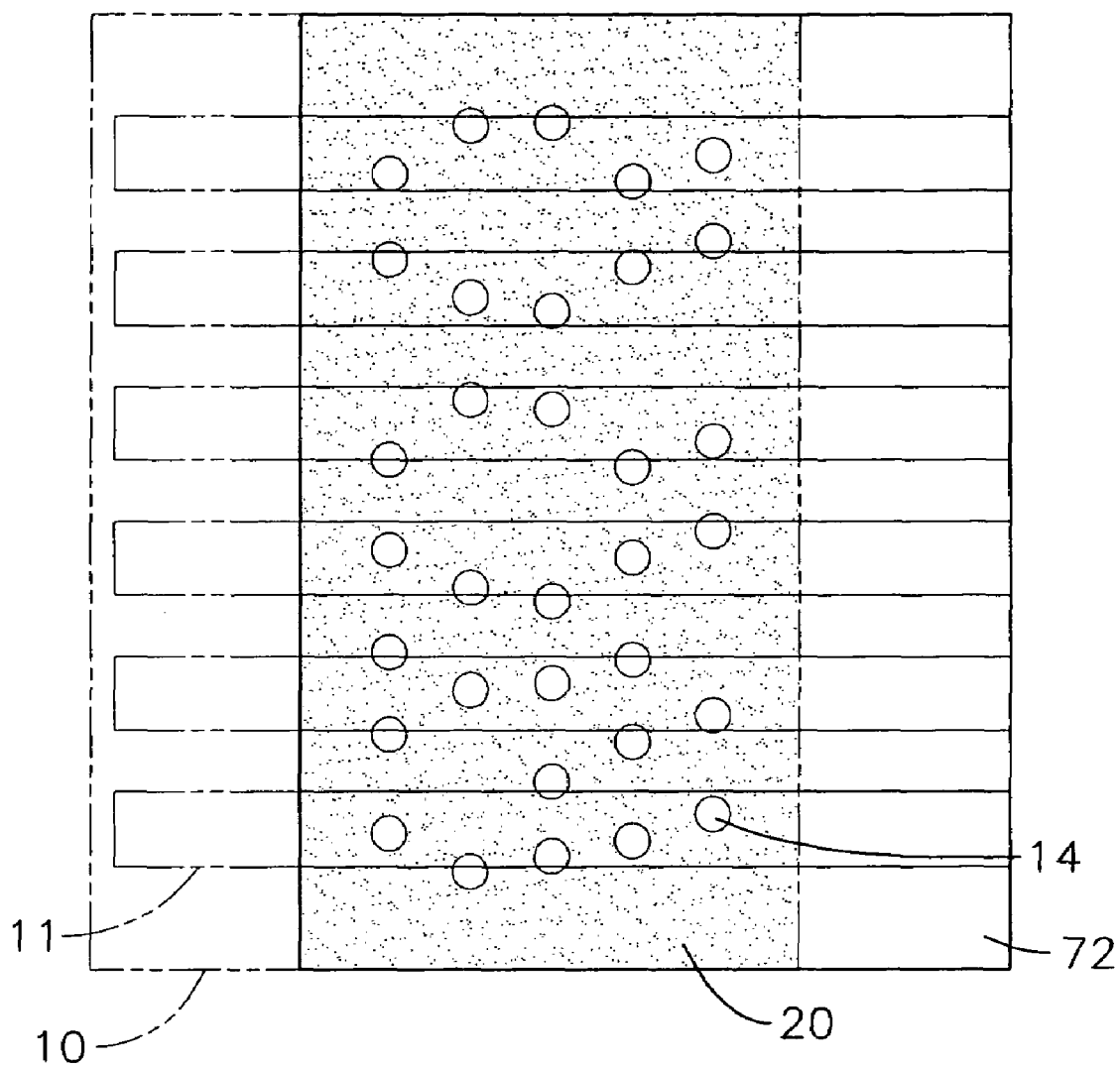
FIG. 4A is a cross-sectional view showing the cable is electrically connected to a task substrate in accordance with the present invention.
Figure 4B:
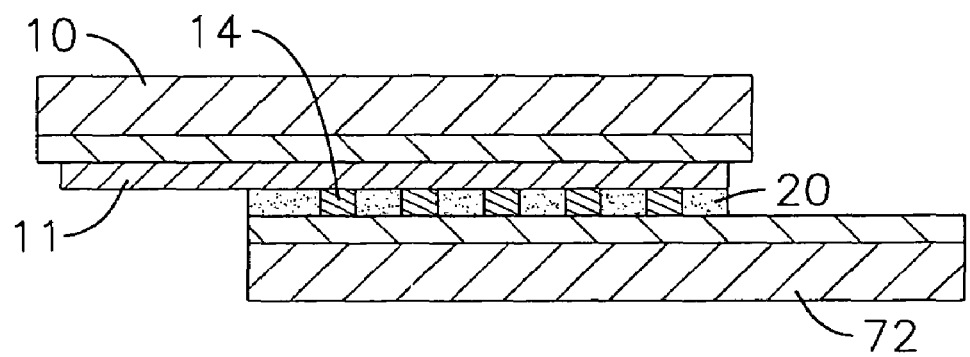
FIG. 4B is a top plan view of FIG. 4A.

With reference to FIGS. 4A and 4B, the cable (10) having conductive bumps (14) can be attached to the task substrate (72) through the non-conducting paste (20). The substrate (72) can be an LCD glass substrate with conductive terminals formed by ITO or metal wires. The non-conducting paste (20) is applied to join the cable (10) and the substrate (72) whereby these bumps (14) can electrically contact the conductive terminals on the substrate (72).

Figure 5:
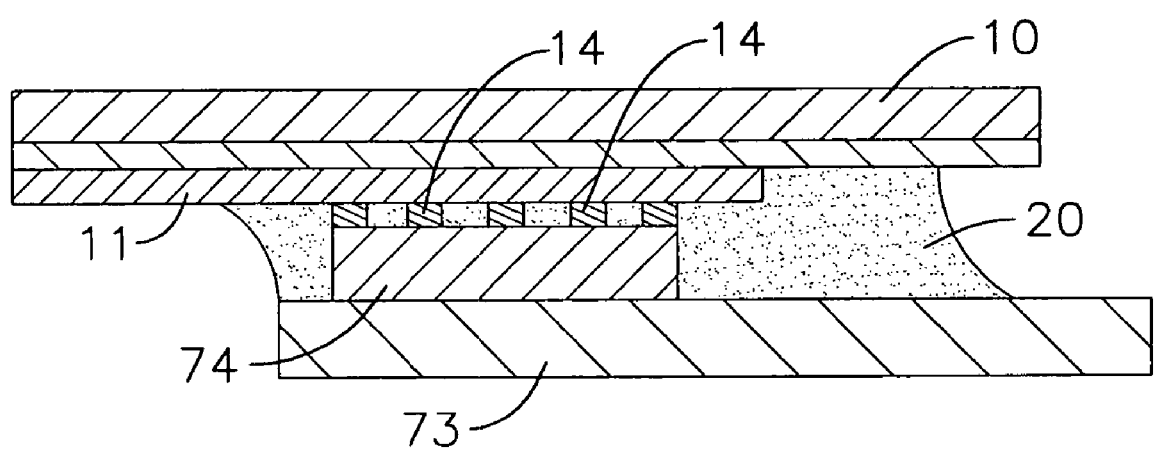
FIG. 5 is a cross-sectional view showing the cable is electrically connected to a task IC in accordance with the present invention.
Figure 6A:
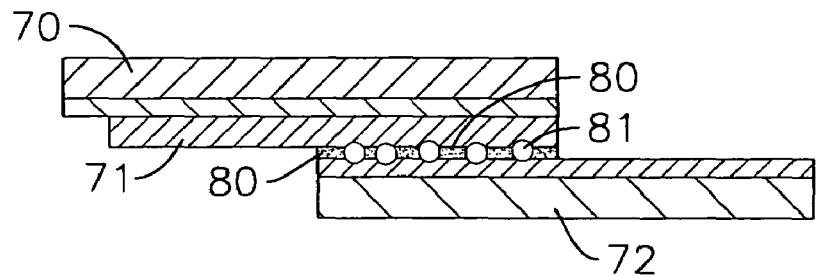
FIG. 6A is a cross-sectional view illustrating that a cable is mounted to a substrate by ACP/ACF.
Figure 6B:
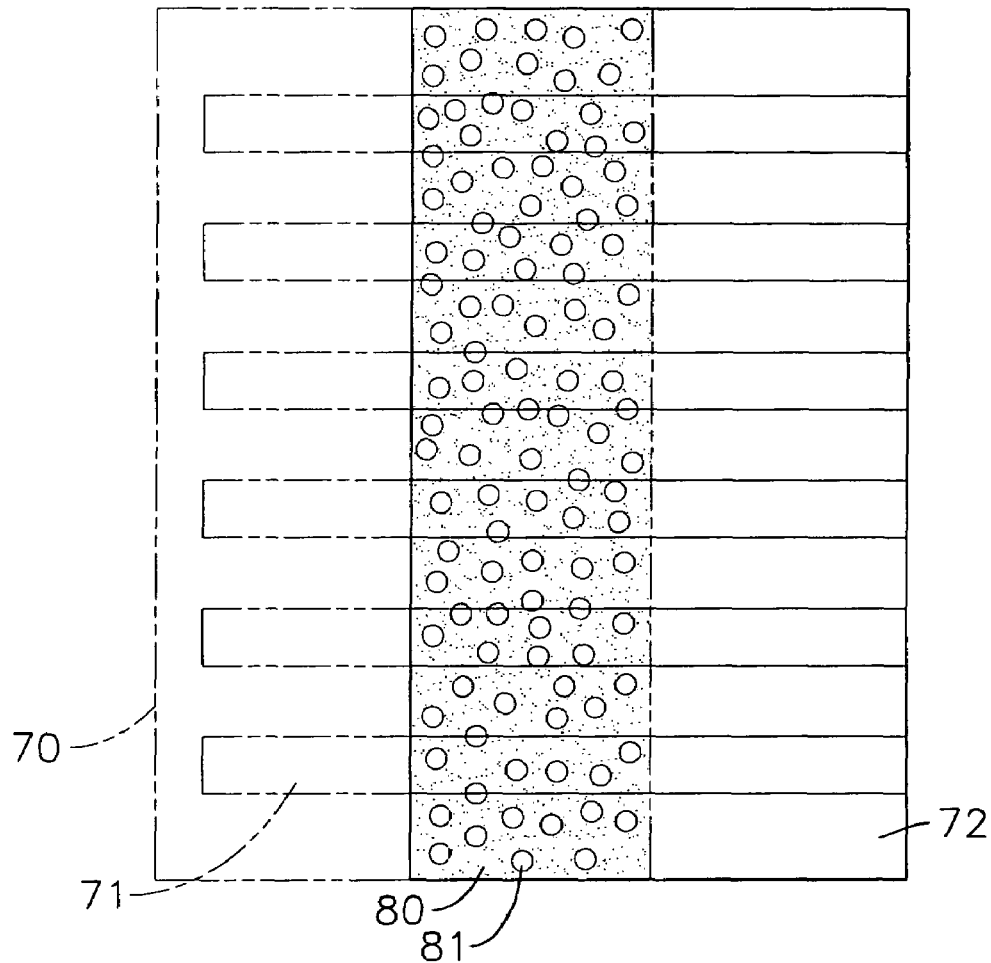
FIG. 6B is top plan view of FIG. 6A.
Figure 7:
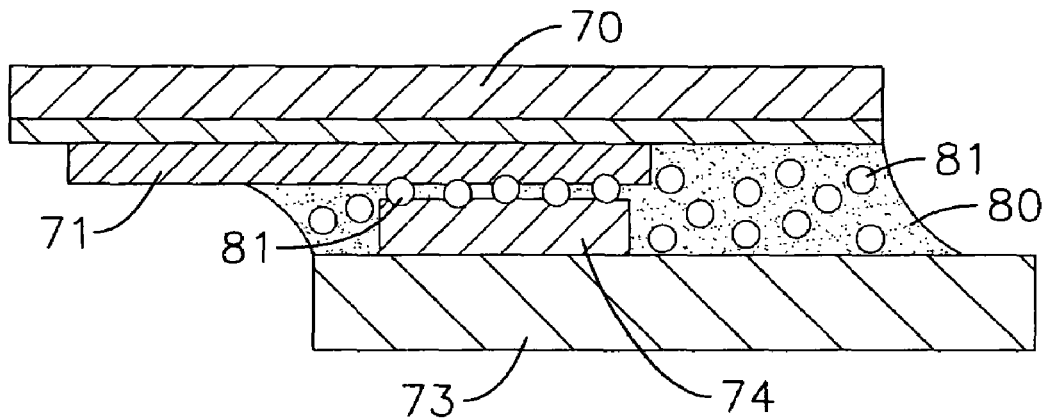
FIG. 7 is a cross-sectional view illustrating that a cable is mounted to an IC by ACP/ACF.
Figure 8:
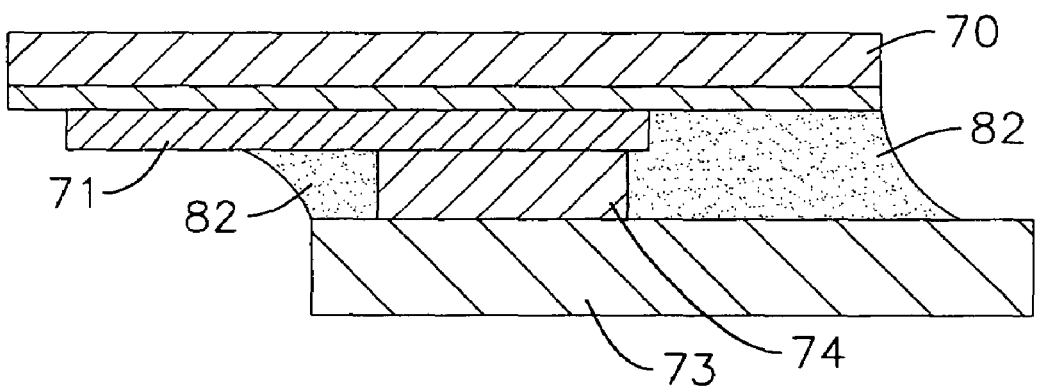
FIG. 8 is a cross-sectional view illustrating that a cable is mounted to an IC by NCP/NCF.

With reference to FIG. 5, the non-conducting paste (20) is also applied to join the cable (10) and an IC (73) whereby these bumps (14) can electrically contact the conductive nodes of the IC (73).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for making a cable, the method comprising:
    forming a conductive circuit on a portion of a cable substrate, another portion of the cable substrate being exposed;
    coating a photoresist layer over the conductive circuit and the exposed cable substrate;
    forming multiple openings equally or randomly distributed in the photoresist layer, wherein a first set of the multiple openings overlap the conductive circuit and a second set of the multiple openings overlap the exposed cable substrate; and
    forming conductive bumps at the openings that overlap the conductive circuit so that the conductive bumps protrude from surfaces of the conductive circuit.

2. The method as claimed in claim 1, wherein the openings are arranged in an array configuration.

3. The method as claimed in claim 1, wherein the conductive bumps are formed by an electroplating process.

4. The method as claimed in claim 1, further comprising coating a protective layer on the conductive bumps, wherein the protective layer is formed by tin, nickel or gold.

5. A method for connecting a cable having conductive bumps to a task object with conductive terminals, the method comprising:
    forming the cable according to claim 1;
    contacting the conductive bumps on the cable to the conductive terminals of the task object; and
    applying non-conductive paste between the cable and the task object to securely join the conductive bumps and the conductive terminals together.

6. The method as claimed in claim 5, wherein the task object is an LCD glass substrate.

7. The method as claimed in claim 5, wherein the task object is a printed circuit board.

8. The method as claimed in claim 1, wherein an included angle defined by the longitudinal direction of the conductive circuit and the multiple openings aligned on a line is formed.

9. The method as claimed in claim 8, wherein the included angle is approximately 45 degree.

10. The method as claimed in claim 1, wherein at least one of the multiple openings concurrently overlaps the conductive circuit and the exposed cable substrate.

11. The method as claimed in claim 1, wherein at least one of the conductive bumps overhangs the exposed substrate.

12. A method for making a cable, the method comprising:
    forming a conductive circuit on a portion of a cable substrate, another portion of the cable substrate being exposed;
    coating a photoresist layer over the conductive circuit and the exposed cable substrate;
    forming multiple openings equally or randomly distributed in the photoresist layer, wherein an included angle defined by the longitudinal direction of the conductive circuit and the multiple openings aligned on a line is formed, such that at least one of the multiple openings concurrently overlap the conductive circuit and the exposed cable substrate; and
    forming conductive bumps at the openings that overlap the conductive circuit so that the conductive bumps protrude from surfaces of the conductive circuits.

13. The method as claimed in claim 12, wherein at least one of the conductive bumps overhangs the exposed substrate.

* * * * *